(12) United States Patent
Kageyama et al.

(10) Patent No.: US 11,619,368 B2
(45) Date of Patent: *Apr. 4, 2023

(54) LIGHT-EMITTING MODULE

(71) Applicant: NICHIA CORPORATION, Anan (JP)

(72) Inventors: Yoshiyuki Kageyama, Tokushima (JP); Kimihiro Miyamoto, Tokushima (JP); Takashi Tani, Naruto (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/833,903

(22) Filed: Jun. 7, 2022

(65) Prior Publication Data

US 2022/0299192 A1 Sep. 22, 2022

Related U.S. Application Data

(63) Continuation of application No. 16/718,181, filed on Dec. 18, 2019, now Pat. No. 11,378,259.

(30) Foreign Application Priority Data

Dec. 19, 2018 (JP) .............................. JP2018-237385
Jun. 6, 2019 (JP) ................................ 2019-106509

(51) Int. Cl.
F21V 19/00 (2006.01)
F21V 29/70 (2015.01)
F21Y 115/10 (2016.01)

(52) U.S. Cl.
CPC ............ *F21V 19/003* (2013.01); *F21V 29/70* (2015.01); *F21Y 2115/10* (2016.08)

(58) Field of Classification Search
CPC ..... F21V 19/003; F21V 29/70; F21Y 2115/10
See application file for complete search history.

(56) References Cited

U.S. PATENT DOCUMENTS 7,182,627 B1 * 2/2007 Huang ................ F21V 19/0035
362/800
9,039,257 B2 * 5/2015 Noro ......................... F21S 8/04
362/382

(Continued)

FOREIGN PATENT DOCUMENTS

JP   2007-158242   6/2007
JP   2012-094587   5/2012

(Continued)

OTHER PUBLICATIONS

Office Action with Form PTO-892 Notice of References Cited issued by the U.S. Patent and Trademark Office for the parent U.S. Appl. No. 16/718,181, dated Aug. 3, 2021.

(Continued)

*Primary Examiner* — Mary Ellen Bowman
(74) *Attorney, Agent, or Firm* — Mori & Ward, LLP

(57) ABSTRACT

A light-emitting module includes a first mounting board having a first surface and a second surface opposite to the first surface. The first mounting board has a recess on the first surface, and the recess has a bottom surface. The first mounting board has an opening passing through the first mounting board from the bottom surface to the second surface. The light-emitting module further includes a second mounting board provided in the recess, a light-emitting element provided on the second mounting board and configured to emit light through the opening, and an elastic cushion provided between the first mounting board and the second mounting board. The light-emitting module also includes a connector. The connector and the opening sandwich a center of the first mounting board when viewed from a direction from the second surface to the first surface.

2 Claims, 17 Drawing Sheets

(56) References Cited

U.S. PATENT DOCUMENTS

| | | | |
|---|---|---|---|
| 11,378,259 B2* | 7/2022 | Kageyama | F21V 19/003 |
| 2007/0200133 A1* | 8/2007 | Hashimoto | H01L 33/486 |
| | | | 439/701 |
| 2012/0294017 A1 | 11/2012 | Nagasaki et al. | |
| 2013/0334974 A1 | 12/2013 | Tamura et al. | |
| 2014/0085884 A1 | 3/2014 | Horio et al. | |
| 2014/0160773 A1 | 6/2014 | Peters et al. | |
| 2014/0177240 A1 | 6/2014 | Noro et al. | |
| 2015/0023016 A1 | 1/2015 | Ishihara et al. | |
| 2016/0116777 A1 | 4/2016 | Kubota et al. | |
| 2018/0292075 A1 | 10/2018 | Leijnse et al. | |
| 2020/0066943 A1 | 2/2020 | Tamura | |

FOREIGN PATENT DOCUMENTS

| | | | | |
|---|---|---|---|---|
| JP | 2012-243512 | 12/2012 | | |
| JP | 2014-007154 | 1/2014 | | |
| JP | 2014-067846 | 4/2014 | | |
| JP | 2014-120332 | 6/2014 | | |
| JP | 2014-123464 | 7/2014 | | |
| JP | 2014-164087 | 9/2014 | | |
| JP | 2014-524640 | 9/2014 | | |
| JP | 2015-023219 | 2/2015 | | |
| JP | 2018-152465 | 9/2018 | | |
| JP | 2019-502247 | 1/2019 | | |
| WO | WO 2013/007796 | 1/2013 | | |
| WO | WO 2013/125112 | 8/2013 | | |
| WO | WO-2013125112 A1 * | 8/2013 | | F21K 9/1355 |
| WO | 2018/105448 | 6/2018 | | |

OTHER PUBLICATIONS

Office Action with Form PTO-892 Notice of References Cited issued by the U.S. Patent and Trademark Office for the parent U.S. Appl. No. 16/718,181, dated Nov. 19, 2021.

Notice of Allowance issued by the United States Patent and Trademark Office for the parent U.S. Appl. No. 16/718,181, dated Mar. 2, 2022.

* cited by examiner

LIGHT-EMITTING MODULE

CROSS-REFERENCE TO RELATED APPLICATIONS

The present application is a continuation application of U.S. patent application Ser. No. 16/718,181, filed Dec. 18, 2019, and claims priority under 35 U.S.C. § 119 to Japanese Patent Application No. 2018-237385, filed Dec. 19, 2018, and Japanese Patent Application No. 2019-106509, filed Jun. 6, 2019. The contents of these applications are incorporated herein by reference in their entirety.

BACKGROUND OF THE INVENTION

1. Field of the Invention

Certain embodiments relate to a light-emitting module.

2. Description of Related Art

Japanese Unexamined Patent Application Publication No. 2012-243512 describes light-emitting modules which employs light-emitting diodes (LEDs) have been developed and used in various applications in recent years. In order to use an LED for an application, such as a headlight of an automobile, which requires a small size and high luminous intensity, high light-output is needed.

SUMMARY OF THE INVENTION

According to one aspect of the present embodiment, a light-emitting module includes a first mounting board, a second mounting board, a light-emitting element, and an elastic cushion. The first mounting board has a first surface and a second surface opposite to the first surface. The first mounting board has a recess on the first surface. The recess has a bottom surface. The first mounting board has an opening passing through the first mounting board from the bottom surface to the second surface. The second mounting board has a mounting surface and a light-emitting element surface opposite to the mounting surface and is provided in the recess such that the light-emitting element surface faces the bottom surface of the recess. The light-emitting element is provided on the light-emitting element surface of the second mounting board and configured to emit light through the opening. The elastic cushion is provided between the bottom surface of the recess and the light-emitting element surface of second mounting board. The second mounting board projects from the first surface of the first mounting board when a force pressing the second mounting board toward the bottom surface of the recess is not applied.

According to another aspect of the present embodiment, a light-emitting module includes a first mounting board, a second mounting board, a light-emitting element, and an elastic cushion. The first mounting board has a first surface and a second surface opposite to the first surface. The first mounting board has a recess on the first surface. The recess has a bottom surface. The first mounting board has an opening passing through the first mounting board from the bottom surface to the second surface. The second mounting board has a mounting surface and a light-emitting element surface opposite to the mounting surface and is provided in the recess such that the light-emitting element surface faces the bottom surface of the recess. The light-emitting element is provided on the light-emitting element surface of the second mounting board and configured to emit light through the opening. The elastic cushion is provided on the first surface of the first mounting board other than the recess.

DETAILED DESCRIPTION OF EMBODIMENTS

First Embodiment

A first embodiment will be described.

Figure 1A:
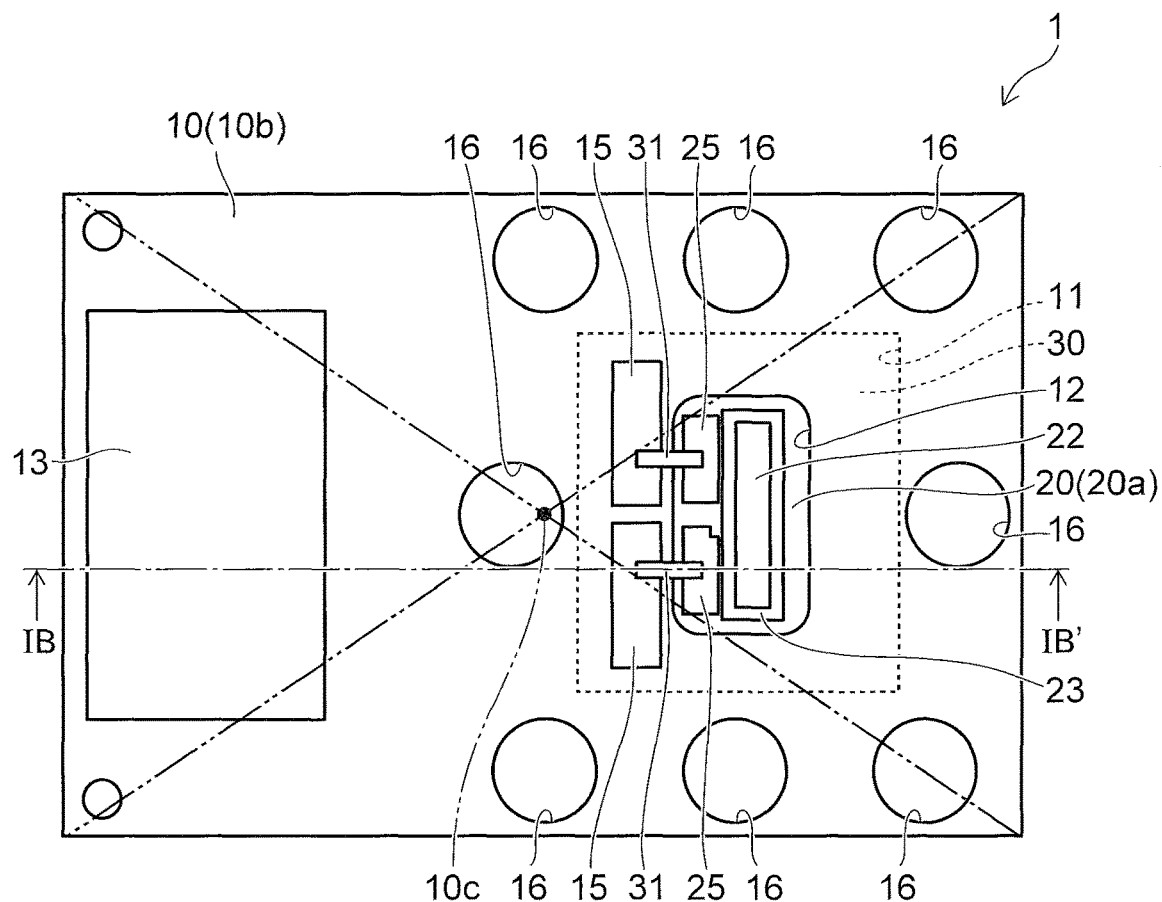
FIG. 1A is a schematic plan view of a light-emitting module according to a first embodiment.
Figure 1B:
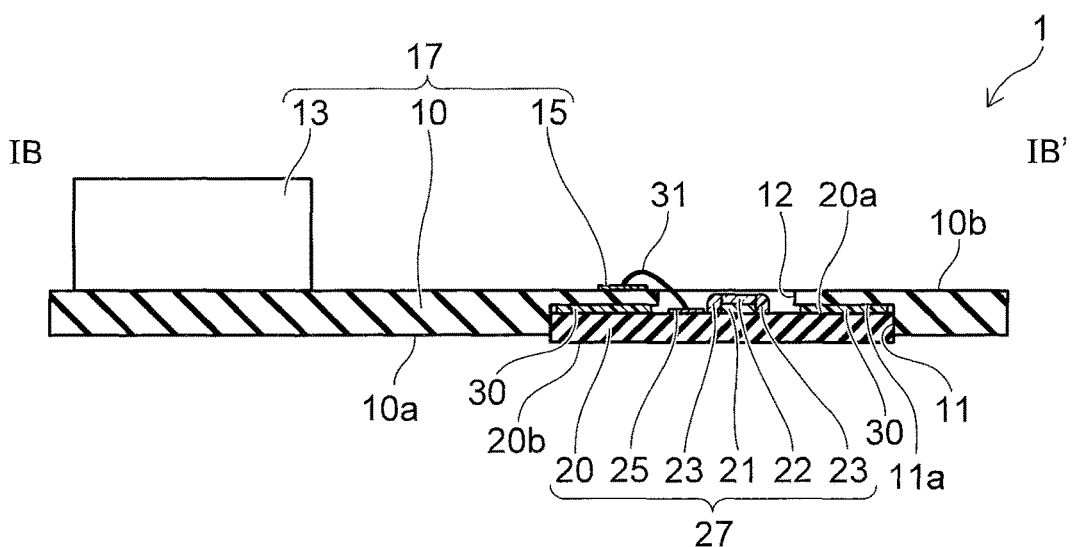
FIG. 1B is a schematic cross-sectional view taken along the line IB-IB' of FIG. 1A.

FIG. 1A is a schematic plan view of a light-emitting module according to the present embodiment. FIG. 1B is a schematic cross-sectional view taken along the line IB-IB' of FIG. 1A.

A light-emitting module 1 according to the present embodiment includes a first mounting board 10 having a first surface 10a and a second surface 10b that faces the first surface 10a, the first surface 10a having a recess 11, a bottom surface 11a of the recess 11 having an opening 12 reaching the second surface 10b; a second mounting board 20 in the recess 11; a light-emitting element 21 that is disposed on the second mounting board 20 and is capable of emitting light through the opening 12; and an elastic cushion 30 between the first mounting board 10 and the second mounting board 20 as shown in FIG. 1A and FIG. 1B.

Further details will be described below.

The light-emitting module 1 according to the present embodiment includes the first mounting board 10. The first mounting board 10 is a module board including a glass epoxy board, a metal board, a ceramic board, or the like. In the first mounting board 10, wiring is disposed inside a base material or on a surface of the base material. Main surfaces of the first mounting board 10 are the first surface 10a and the second surface 10b. The first surface 10a and the second surface 10b face each other.

The first surface 10a has the recess 11. The shape of the recess 11 is, for example, rectangular when viewed in the direction from the first surface 10a to the second surface 10b (hereinafter also referred to as a "vertical direction"). The bottom surface 11a of the recess 11 has the opening 12. The opening 12 reaches the second surface 10b of the first mounting board 10. That is, the opening 12 is bored through the first mounting board 10 in the thickness direction. When viewed in the vertical direction (hereinafter also referred to as "in a plan view"), the shape of the opening 12 is, for example, rounded rectangular, and the opening 12 is located inside the recess 11.

A connector 13 is mounted on the second surface 10b of the first mounting board 10. The connector 13 can be electrically connected to an external power supply. A pair of first pads 15 are disposed on the second surface 10b. The first pads 15 are made of, for example, metal. The connector 13 is electrically connected to the first pads 15 via the wiring inside the first mounting board 10. The opening 12 and the connector 13 are located on both sides of a center 10c of the first mounting board 10 when viewed in the direction from the second surface 10b to the first surface 10a (a vertical direction). In the case in which the shape of the first mounting board 10 is rectangular in a plan view, the center 10c is an intersection point of the diagonal lines of the first mounting board 10.

The first mounting board 10 has two or more through-holes 16. The through-holes 16 extend in the vertical direction and reach the first surface 10a and the second surface 10b. As described later, the through-holes 16 are used to screw the first mounting board 10 on a fixing base 100. Eight through-holes 16 are formed in the example shown in FIG. 1A, but this structure is not limiting. Two or more through-holes 16 need to be provided to sandwich the recess 11.

The first mounting board 10, the connector 13, and the first pads 15 constitute a module structure 17. The recess 11, the opening 12, and the through-holes 16 are formed in the first mounting board 10.

The second mounting board 20 is disposed in the recess 11 of the first mounting board 10. The second mounting board 20 is formed into, for example, a rectangular plate that just fits into the recess 11 in a plan view. The second mounting board 20 contains a metal or ceramic. For example, the second mounting board 20 is a ceramic board such as an aluminum nitride (AlN) board. Main surfaces of the second mounting board 20 are a first surface (a light-emitting element surface) 20a and a second surface (a mounting surface) 20b, which face each other. The first surface 20a is closer to the first mounting board 10.

The light-emitting element 21 is mounted on the first surface 20a of the second mounting board 20. The light-emitting element 21 is, for example, a light-emitting diode (LED). The light-emitting element 21 is located in the opening 12 of the first mounting board 10 in a plan view and can emit light through the opening 12.

A phosphor layer 22 may be disposed on the light-emitting element 21. In the phosphor layer 22, a lot of phosphor particles are dispersed in a base material made of a transparent resin. A lateral wall 23 may be disposed around the light-emitting element 21 and the phosphor layer 22 in a plan view. The lateral wall 23 is made of, for example, a white resin. A pair of second pads 25 are disposed on the first surface 20a. The second pads 25 are made of, for example, metal. The second pads 25 are electrically connected to the light-emitting element 21. In an example shown in FIG. 1A and FIG. 1B, the second mounting board 20, the light-emitting element 21, the phosphor layer 22, the lateral wall 23, and the second pads 25 constitute a light-emitting device 27.

The light-emitting module 1 includes a pair of wires 31 that connect the pair of first pads 15 to the pair of second pads 25. With this structure, the anode and cathode of the light-emitting element 21 can be connected to the external power supply via the pair of second pads 25, the pair of wires 31, the pair of first pads 15, the wiring provided for the first mounting board 10, and the connector 13.

The cushion 30 is disposed between the module structure 17 and the light-emitting device 27, more specifically between the bottom surface 11a of the recess 11 of the first mounting board 10 and the first surface 20a of the second mounting board 20. For example, the cushion 30 is bonded to the bottom surface 11a of the recess 11 of the first mounting board 10 with an adhesive and to the first surface 20a of the second mounting board 20 with an adhesive. In the case in which the cushion 30 is self-adhesive, the adhesives are not required. For example, the cushion 30 has a layered structure, and the outer periphery of the cushion 30 is slightly smaller than the outer periphery of the recess 11 in a plan view. The cushion 30 has an opening made at a position corresponding to the opening 12.

The cushion 30 is made of an elastic material, preferably a material with a modulus of elasticity of 0.1 MPa to 1,000 MPa, more preferably a material with a modulus of elasticity of 1 MPa to 100 MPa. The cushion 30 can thus undergo elastic deformation. For example, the cushion 30 becomes thin when a compressive force in the thickness direction is applied to the cushion 30, and the cushion 30 returns to the original thickness when the compressive force is removed. For example, the cushion 30 contains at least one of graphite and an elastic resin material. The cushion 30 is preferably made of an elastic and heat-resistant material and preferably contains a silicone resin. The thickness of the cushion 30 is preferably 200 μm or less.

Next, the operation of the light-emitting module 1 according to the present embodiment will be described.

Figure 2A:
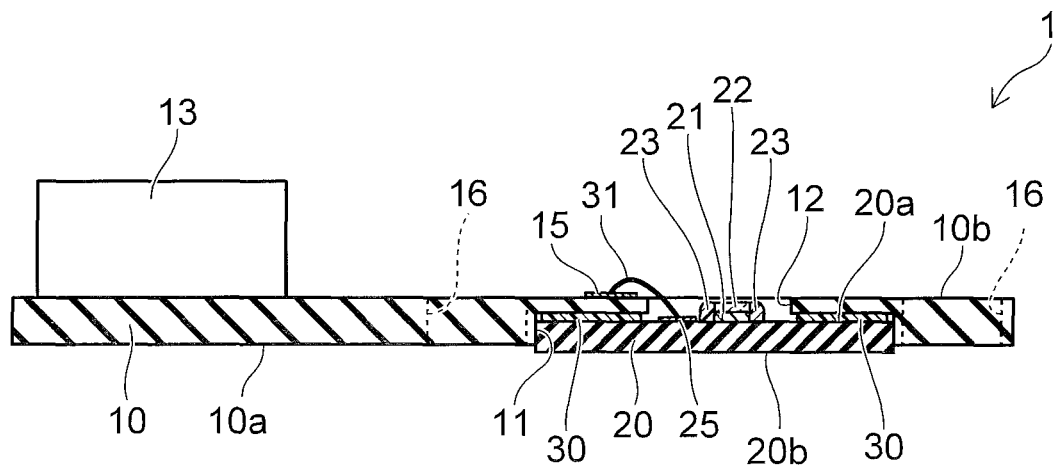
FIG. 2A is a schematic cross-sectional view of the light-emitting module according to the first embodiment not fixed to a fixing base.
Figure 2B:
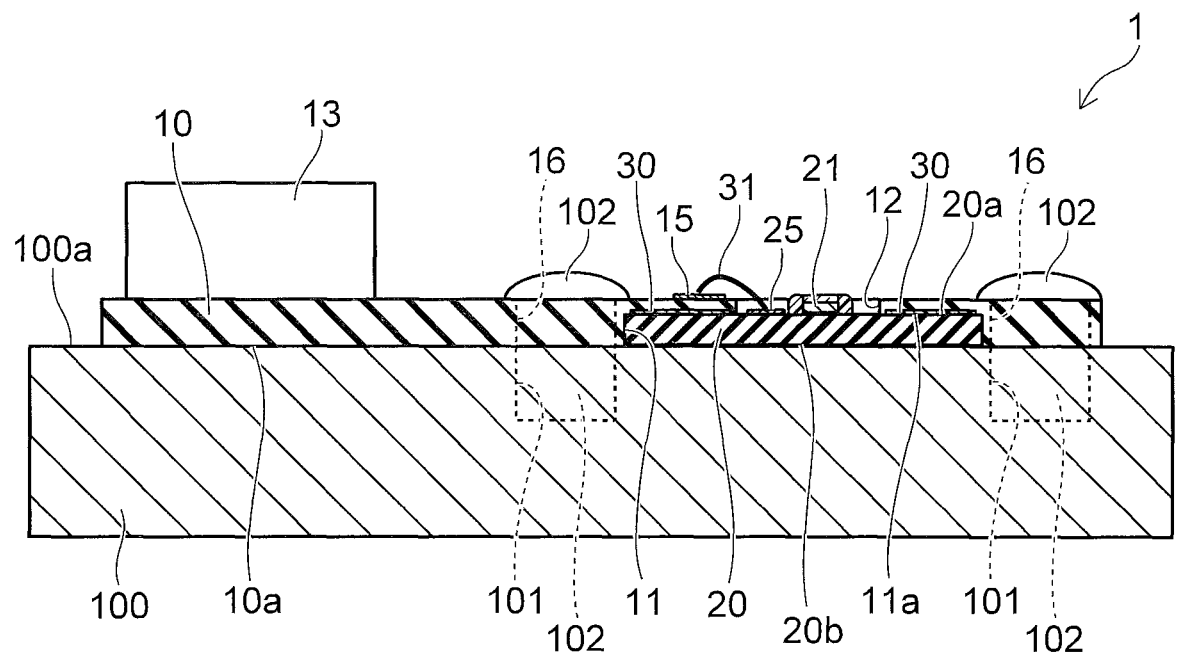
FIG. 2B is a schematic cross-sectional view of the light-emitting module according to the first embodiment fixed to the fixing base.

FIG. 2A is a schematic cross-sectional view of the light-emitting module according to the present embodiment not fixed to the fixing base (hereinafter also referred to as a "free state"). FIG. 2B is a schematic cross-sectional view of the light-emitting module according to the present embodiment fixed to the fixing base (hereinafter also referred to as a "fixed state").

As shown in FIG. 2A, a force that presses the second mounting board 20 against the first mounting board 10 is not applied in the free state. Hence, the compressive force is not applied to the cushion 30. In this state, the second mounting board 20 partially projects at the second surface 20b from the first surface 10a of the first mounting board 10. The amount of projection is preferably half or less of the thickness of the cushion 30. The entire second surface 20b of the second mounting board 20 is thus easily brought into contact with the first surface 100a of the fixing base 100.

As shown in FIG. 2B, the light-emitting module 1 is fixed to the fixing base 100 in the fixed state. The fixing base 100 is, for example, a heat sink. Threaded holes 101 are made on the first surface 100a of the fixing base 100. The threaded holes 101 are located at positions corresponding to the positions of the through-holes 16 of the light-emitting module 1. Screws 102 are inserted into the through-holes 16 of the first mounting board 10 and tightened in the threaded holes 101 of the fixing base 100, so that the first mounting board 10 is mechanically connected to the fixing base 100. The light-emitting module 1 is thus fixed to the fixing base 100. At this time, the light-emitting module 1 is fixed to the fixing base 100 at two or more positions to sandwich the opening 12 of the first mounting board 10, that is, at two or more positions to sandwich the light-emitting device 27. Hence, the second surface 20b of the second mounting board 20 is not detached from the first surface 100a of the fixing base 100.

At this time, the second mounting board 20 and the cushion 30 are pressed between the first mounting board 10 and the fixing base 100, so that the compressive force is applied. Accordingly, the cushion 30 is elastically deformed and becomes thin, and the position of the second surface 20b of the second mounting board 20 in the vertical direction substantially coincides with the position of the first surface 10a of the first mounting board 10. Consequently, the first surface 10a of the first mounting board 10 and the second surface 20b of the second mounting board 20 are brought into contact with the first surface 100a of the fixing base 100. At this time, the second surface 20b of the second mounting board 20 is pressed against the first surface 100a of the fixing base 100 by the elastic force of the cushion 30.

If power from the external power supply is applied to the light-emitting element 21 to turn on the light-emitting element 21 in this state, heat generated in the light-emitting element 21 is transmitted through the second mounting board 20 to the fixing base 100, which is a heat sink. As the second mounting board 20 is in direct contact with and pressed against the fixing base 100, thermal resistance between the second mounting board 20 and the fixing base 100 is low. Accordingly, heat generated in the light-emitting element 21 can be efficiently released to the fixing base 100, so that increase in the temperature of the light-emitting module 1 can be reduced.

Next, the effects of the present embodiment will be described.

In the present embodiment, the elastic cushion 30 is disposed between the module structure 17 and the light-emitting device 27, and the cushion 30 is compressed in the fixed state. Hence, the entire second surface 20b of the second mounting board 20 is in contact with and pressed against the first surface 100a of the fixing base 100. High heat dissipation performance can thus be achieved. A light-emitting module according to a comparative example having substantially the same structure as in the present embodiment except that the cushion 30 was not disposed was assumed. A thermal simulation was performed on the light-emitting module 1 according to the present embodiment including the cushion 30 and the light-emitting module according to the comparative example under the same conditions. The result showed that the junction temperature (Tj) of the present embodiment (with the cushion 30) was 4.2% lower than the junction temperature of the comparative example (without the cushion 30).

As the cushion 30 is elastic, even if the second surface 20b of the second mounting board 20 is inclined with respect to the first surface 10a of the first mounting board 10 in the free state, the cushion 30 absorbs the inclination, and the entire second surface 20b of the second mounting board 20 can be in contact with the first surface 100a of the fixing base 100. Similarly, even if the bottom surface 11a of the recess 11 of the first mounting board 10 or the first surface 20a of the second mounting board 20 has fine irregularities, the cushion 30 absorbs the irregularities, and the second surface 20b of the second mounting board 20 can be stably in contact with the first surface 100a of the fixing base 100. Consequently, the heat dissipation performance can be stabilized. As described above, the light-emitting module 1 according to the present embodiment has a high tolerance for the precision of assembly and can stably offer high heat dissipation performance. Hence, the light-emitting module 1 is reliable, and variations between the light-emitting modules 1 are small.

Further, in the present embodiment, in the free state, the second surface 20b of the second mounting board 20 projects from the first surface 10a of the first mounting board 10. Hence, in the case in which the first surface 100a of the fixing base 100 is flat, the cushion 30 is compressed, and the second mounting board 20 can be pressed against the fixing base 100 by the elastic force of the cushion 30 in the fixed state.

In the present embodiment, the first surface 100a of the fixing base 100 is flat, and the second surface 20b of the second mounting board 20 projects from the first surface 10a of the first mounting board 10 in the free state. However, this structure is not limiting. The positional relationship between the first surface 10a and the second surface 20b in the vertical direction can be appropriately selected depending on the shape of the region of the first surface 100a of the fixing base 100 in which the light-emitting module 1 is installed.

Second Embodiment

Next, a second embodiment will be described.

Figure 3A:
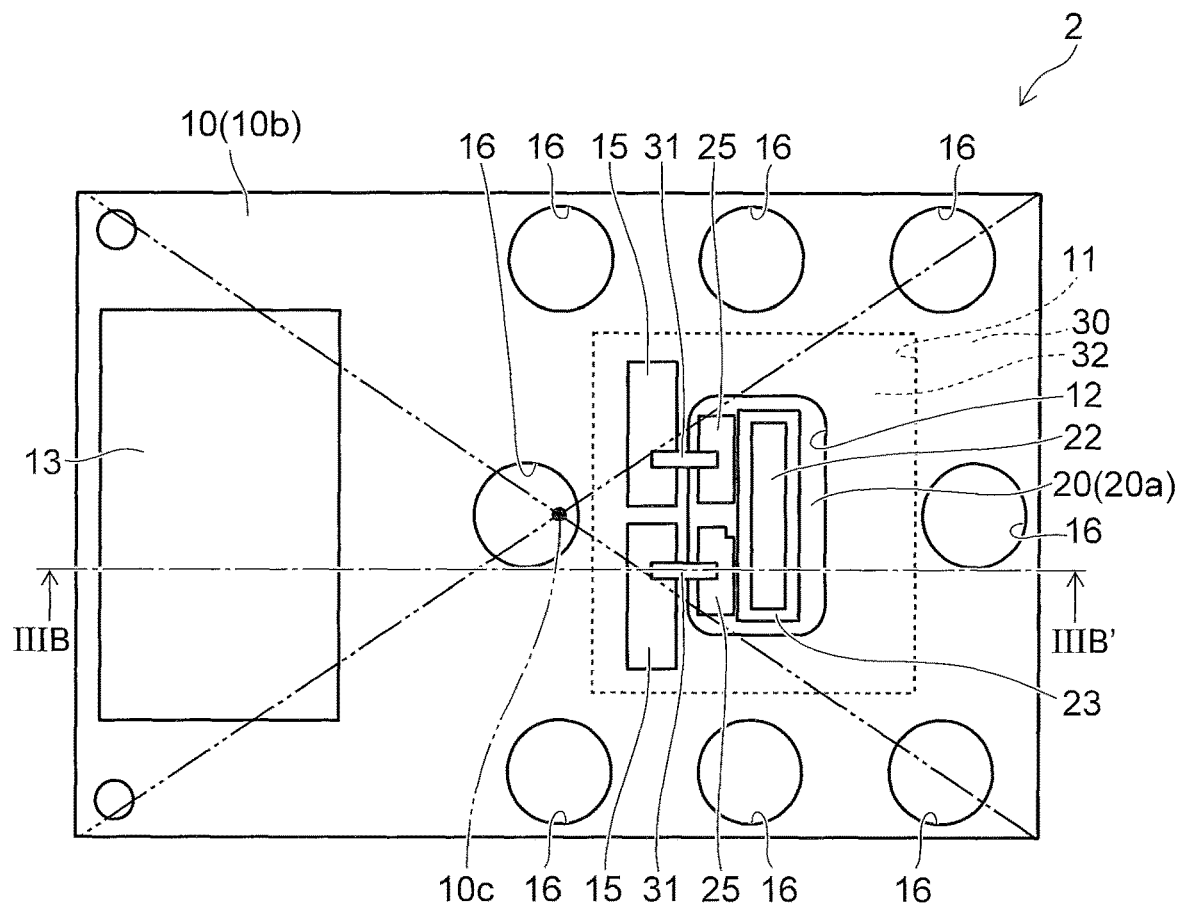
FIG. 3A is a schematic plan view of a light-emitting module according to a second embodiment.
Figure 3B:
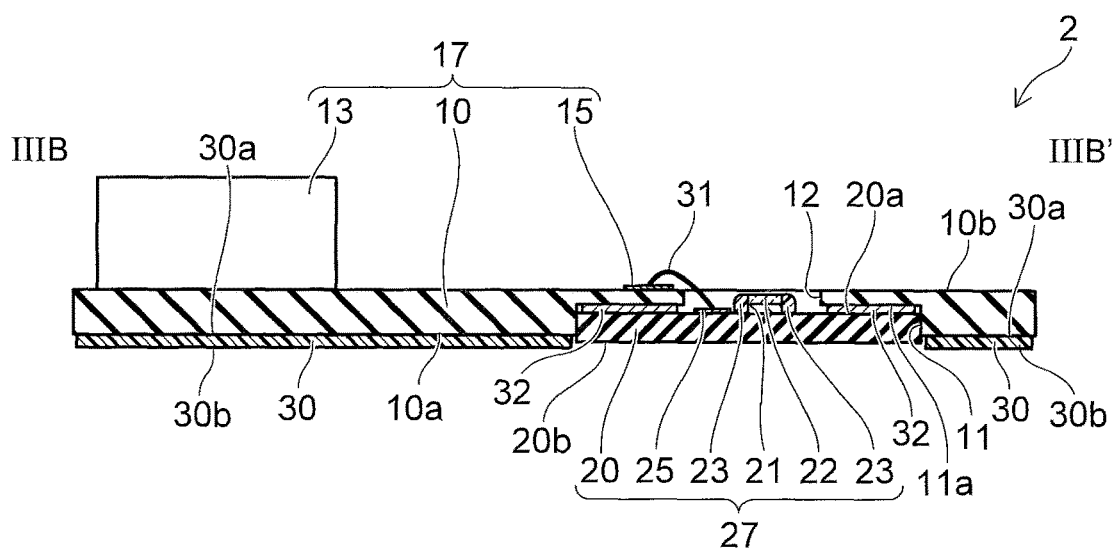
FIG. 3B is a schematic cross-sectional view taken along the line IIIB-IIIB' of FIG. 3A.

FIG. 3A is a schematic plan view of a light-emitting module according to the present embodiment. FIG. 3B is a schematic cross-sectional view taken along the line IIIB-IIIB' of FIG. 3A.

As shown in FIG. 3A and FIG. 3B, in a light-emitting module 2 according to the present embodiment, the position of the cushion 30 is different from the position in the light-emitting module 1 according to the first embodiment. That is, the cushion 30 is not disposed between the first mounting board 10 and the second mounting board 20 but is disposed in the region of the first surface 10a of the first mounting board 10 except for the recess 11. For example, the cushion 30 has a layered structure, and the outer periphery of the cushion 30 is slightly smaller than the outer periphery of the first mounting board 10 in a plan view. The cushion 30 has an opening made at a position corresponding to the recess 11. A first surface 30a of the cushion 30 is in contact with the first surface 10a of the first mounting board 10, and a second surface 30b of the cushion 30 is exposed. The second surface 30b faces the first surface 30a.

A spacer 32 may be disposed at a position where the cushion 30 is disposed in the first embodiment, that is, between the bottom surface 11a of the recess 11 of the first mounting board 10 and the first surface 20a of the second mounting board 20. The spacer 32 is made of, for example, a metal, ceramic, or resin material. For example, the thermal conductivity of the spacer 32 is higher than the thermal conductivity of the cushion 30. The structure in the present embodiment is substantially the same as in the first embodiment except for the above-described points.

That is, the light-emitting module 2 according to the present embodiment includes the first mounting board 10 having the first surface 10a and the second surface 10b that faces the first surface 10a, the first surface 10a having the recess 11, the bottom surface 11a of the recess 11 having the opening 12 reaching the second surface 10b; the second mounting board 20 in the recess 11; the light-emitting element 21 that is disposed on the second mounting board 20 and is capable of emitting light through the opening 12; and the elastic cushion 30 disposed in a region of the first surface 10a of the first mounting board 10 other than the recess 11.

Next, the operation of the light-emitting module 2 according to the present embodiment will be described.

Figure 4A:
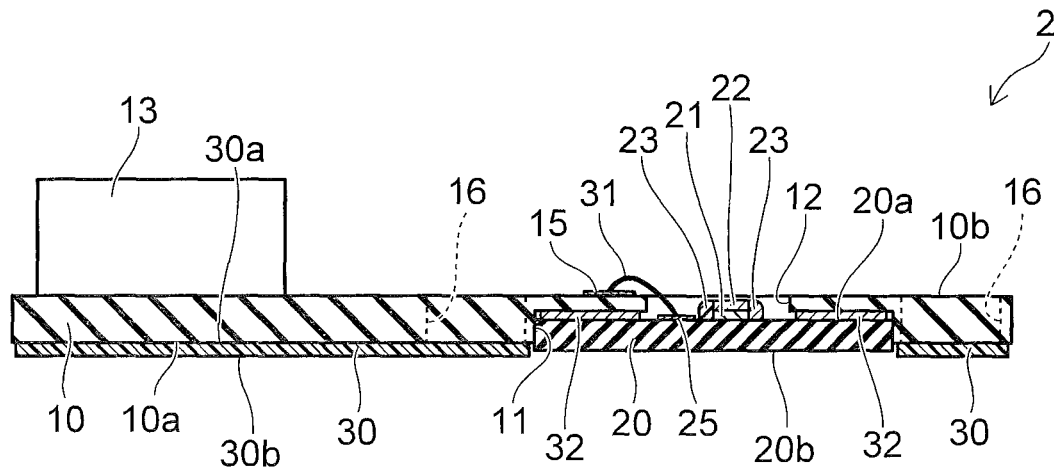
FIG. 4A is a schematic cross-sectional view of the light-emitting module according to the second embodiment not fixed to the fixing base.
Figure 4B:
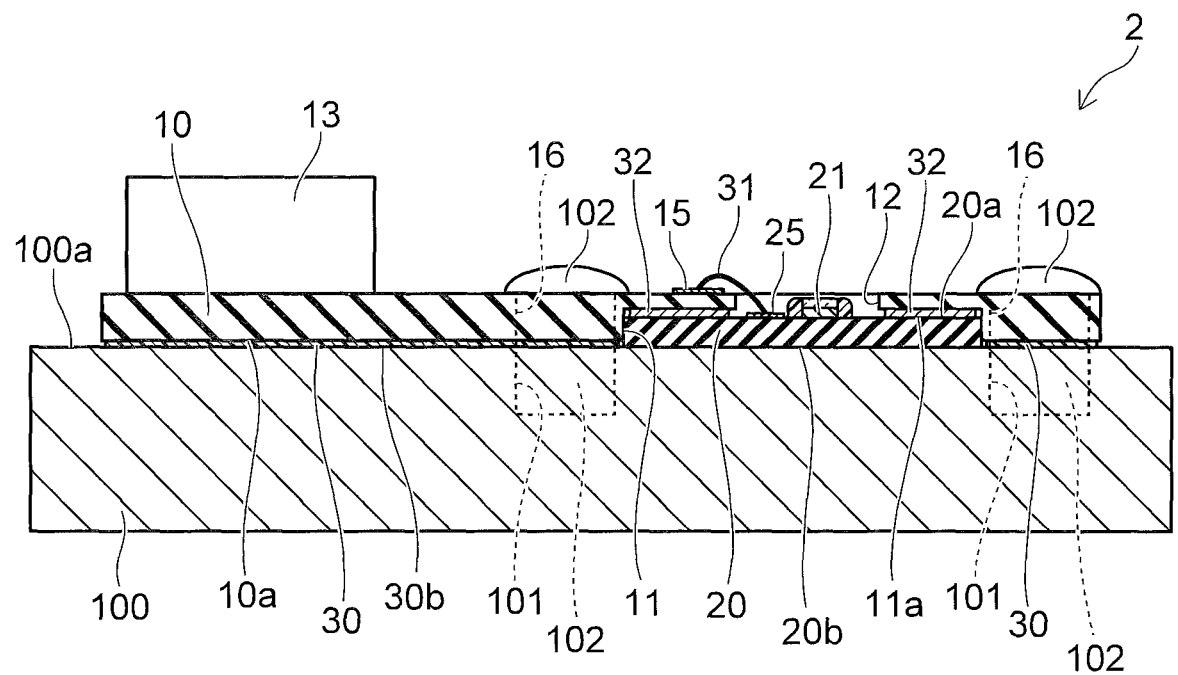
FIG. 4B is a schematic cross-sectional view of the light-emitting module according to the second embodiment fixed to the fixing base.

FIG. 4A is a schematic cross-sectional view of the light-emitting module according to the present embodiment not fixed to the fixing base (free state). FIG. 4B is a schematic cross-sectional view of the light-emitting module according to the present embodiment fixed to the fixing base (fixed state).

As shown in FIG. 4A, a force that presses the first mounting board 10 against the fixing base 100 is not applied in the free state. Hence, the compressive force is not applied to the cushion 30. In this state, the cushion 30 partially projects at the second surface 30b from the second surface 20b of the second mounting board 20.

As shown in FIG. 4B, the light-emitting module 2 is fixed to the fixing base 100 with the screws 102 in the fixed state. The structure of the fixing base 100 is substantially the same as in the first embodiment. In the fixed state, the cushion 30 is pressed between the first mounting board 10 and the fixing base 100, so that the compressive force is applied. Accordingly, the cushion 30 is elastically deformed and becomes thin, and the position of the second surface 30b of the cushion 30 in the vertical direction substantially coincides with the position of the second surface 20b of the second mounting board 20. Consequently, the second surface 30b of the cushion 30 and the second surface 20b of the second mounting board 20 are brought into contact with the first surface 100a of the fixing base 100. At this time, the second surface 20b of the second mounting board 20 is pressed against the first surface 100a of the fixing base 100 by the clamping force of the screws 102. At this time, the light-emitting module 1 is fixed to the fixing base 100 at two or more positions to sandwich the opening 12 of the first mounting board 10, that is, at two or more positions to sandwich the light-emitting device 27. Hence, the second surface 20b of the second mounting board 20 is not detached from the first surface 100a of the fixing base 100.

If the light-emitting element 21 is turned on in this state, heat generated in the light-emitting element 21 is transmitted through the second mounting board 20 to the fixing base 100, which is a heat sink. As the second mounting board 20 is in direct contact with and pressed against the fixing base 100, thermal resistance between the second mounting board 20 and the fixing base 100 is low. Heat generated in the light-emitting element 21 is transmitted to the fixing base 100 also through the second mounting board 20, the first mounting board 10, and the cushion 30. Accordingly, heat generated in the light-emitting element 21 can be efficiently released to the fixing base 100. Consequently, increase in the temperature of the light-emitting module 2 can be reduced.

The operation in the present embodiment is substantially the same as in the first embodiment except for the above-described points.

Next, the effects of the present embodiment will be described.

In the present embodiment, even in the case in which there is a difference in level between the second surface 20b of the second mounting board 20 and the first surface 10a of the first mounting board 10, the cushion 30 is elastically deformed and absorbs the difference, and both of the cushion 30 and the second mounting board 20 can be stably in contact with the fixing base 100. Even if the second surface 20b of the second mounting board 20 is inclined with respect to the first surface 10a of the first mounting board 10, the cushion 30 absorbs the inclination, and the entire second surface 20b of the second mounting board 20 can be in contact with the first surface 100a of the fixing base 100. In addition, even if the first surface 10a of the first mounting board 10 has fine irregularities, the cushion 30 absorbs the irregularities, the entire first surface 30a of the cushion 30 is in contact with the first surface 10a of the first mounting board 10, and the entire second surface 30b of the cushion 30 is in contact with the first surface 100a of the fixing base 100. Accordingly, the light-emitting module 2 has a high margin of error in the precision of the dimensions of the parts thereof and in the precision of the assembly of the parts, and heat can be efficiently and stably dissipated from the light-emitting element 21 to the fixing base 100.

In the present embodiment, the first surface 100a of the fixing base 100 is flat, and the cushion 30 projects from the second surface 20b of the second mounting board 20 in the free state. However, this structure is not limiting. The positional relationship between the second surface 30b of the cushion 30 and the second surface 20b of the second mounting board 20 in the vertical direction can be appropriately selected depending on the shape of the region of the first surface 100a of the fixing base 100 in which the light-emitting module 2 is installed.

The effects in the present embodiment are substantially the same as in the first embodiment except for the above-described points.

Third Embodiment

Next, a third embodiment will be described.

Figure 5:
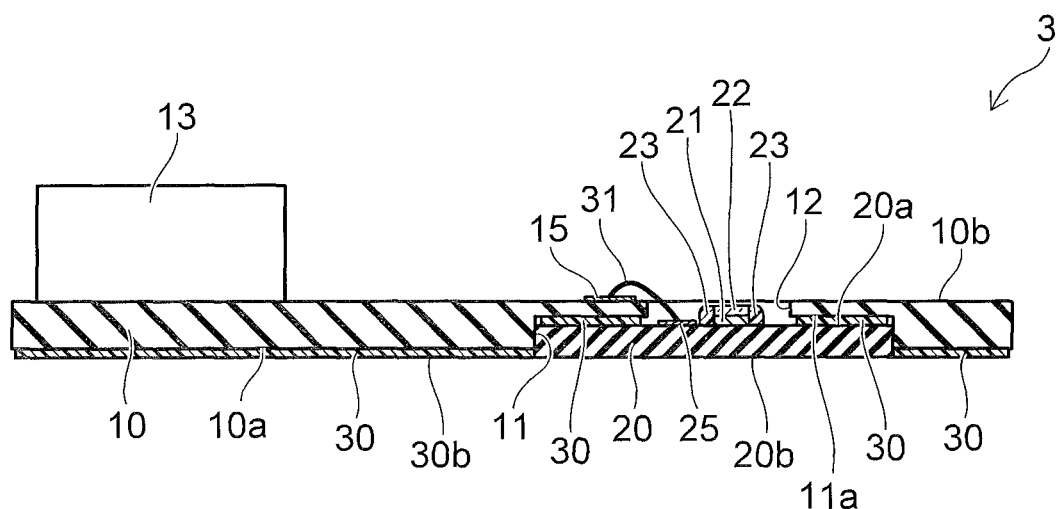
FIG. 5 is a schematic cross-sectional view of a light-emitting module according to a third embodiment.

FIG. 5 is a schematic cross-sectional view of a light-emitting module according to the present embodiment.

The present embodiment is a combination of the first and second embodiments described above.

As shown in FIG. 5, in a light-emitting module 3 according to the present embodiment, the cushion 30 is disposed between the bottom surface 11a of the recess 11 of the first mounting board 10 and the first surface 20a of the second mounting board 20 and disposed in the region of the first surface 10a of the first mounting board 10 except for the recess 11. The position of the second surface 30b of the cushion 30 disposed on the first surface 10a of the first mounting board 10 and the position of the second surface 20b of the second mounting board 20 in the vertical direction may be the same or different.

The structure, operation, and effects in the present embodiment are substantially the same as in the first or second embodiment except for the above-described points.

Modifications

Modifications of the above-described embodiments will be described below.

FIG. 6A to FIG. 8B are schematic bottom views for illustrating the positional relationship between the first mounting board and the cushion in modifications of the first embodiment.

To facilitate understanding of the drawings, the cushion 30 is indicated by hatching in FIG. 6A to FIG. 8B. Illustration of the through-holes 16 is omitted.

Figure 6A:
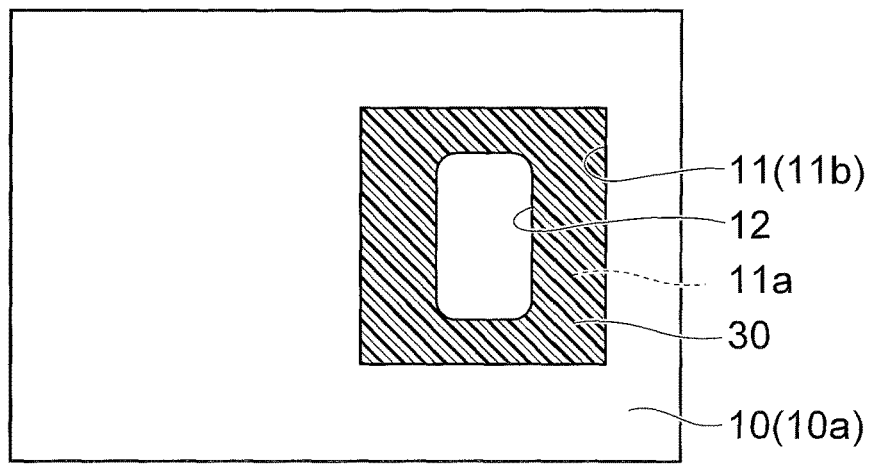
FIG. 6A is a schematic bottom view for illustrating the positional relationship between a first mounting board and a cushion in the first embodiment.

As shown in FIG. 6A, the cushion 30 may be disposed over the entire bottom surface 11a of the recess 11 of the first mounting board 10. This structure corresponds to the first embodiment. Actually, a minute gap may be present between a lateral surface 11b of the recess 11 and a lateral surface of the cushion 30, and a minute gap may be present between a lateral surface of the opening 12 and a lateral surface of the cushion 30 in a plan view. The first embodiment includes such a case.

Figure 6B:
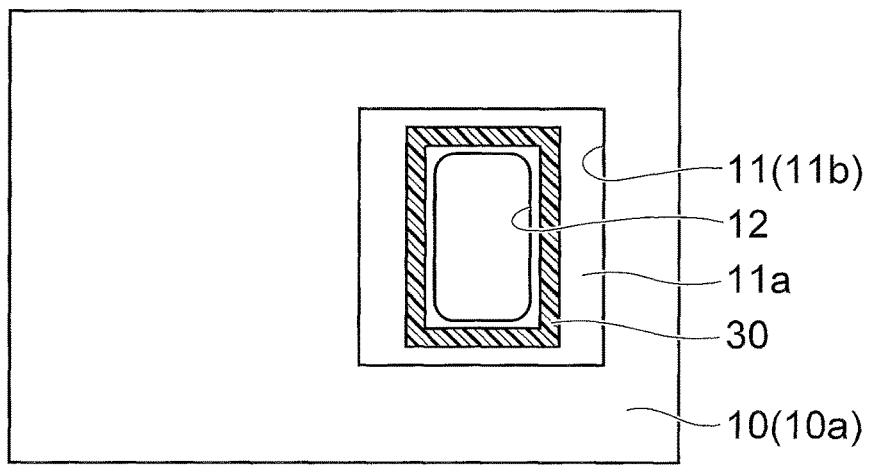
FIG. 6B is a schematic bottom view for illustrating the positional relationship between the first mounting board and the cushion in a modification of the first embodiment.
Figure 6C:
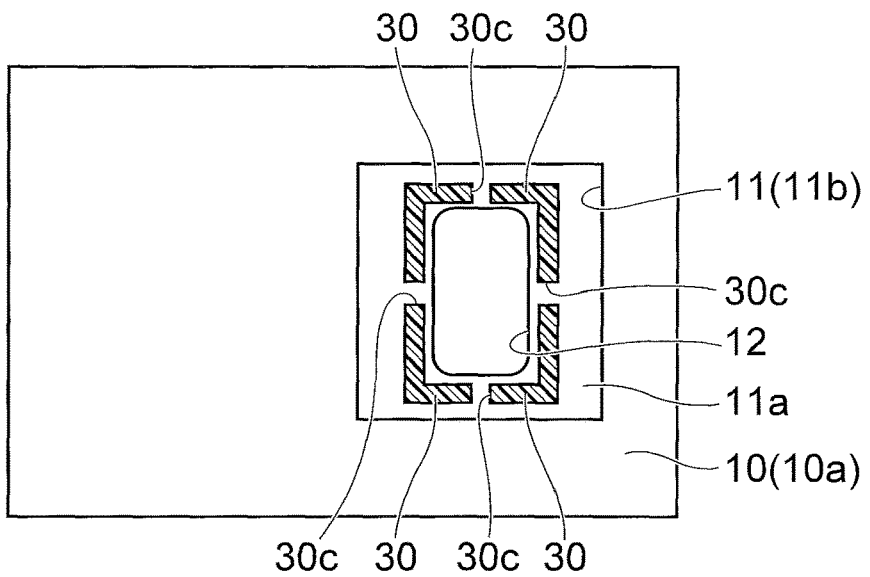
FIG. 6C is a schematic bottom view for illustrating the positional relationship between the first mounting board and the cushion in a modification of the first embodiment.
Figure 7A:
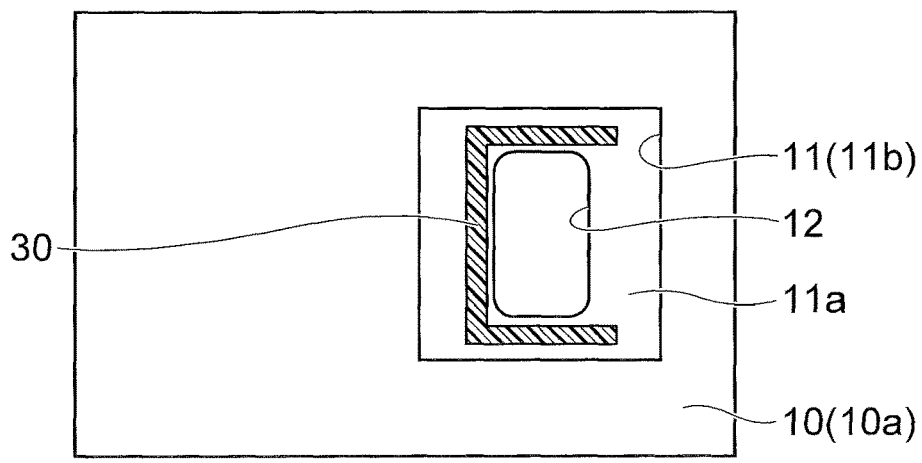
FIG. 7A is a schematic bottom view for illustrating the positional relationship between the first mounting board and the cushion in a modification of the first embodiment.
Figure 7B:
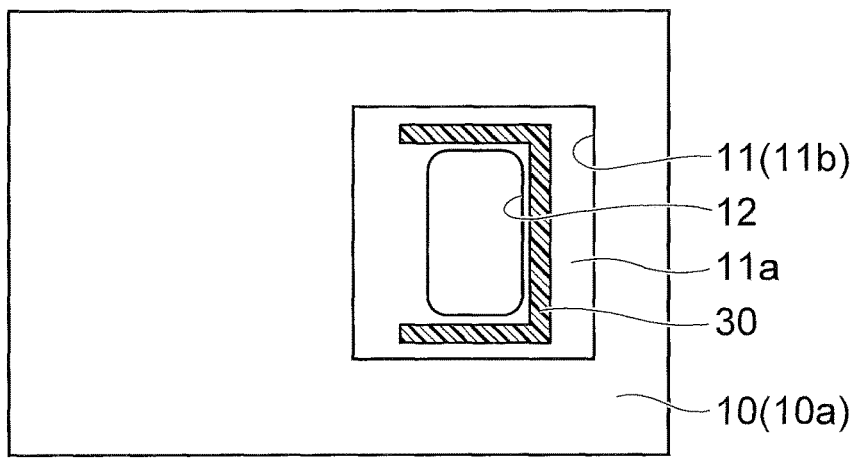
FIG. 7B is a schematic bottom view for illustrating the positional relationship between the first mounting board and the cushion in a modification of the first embodiment.
Figure 7C:
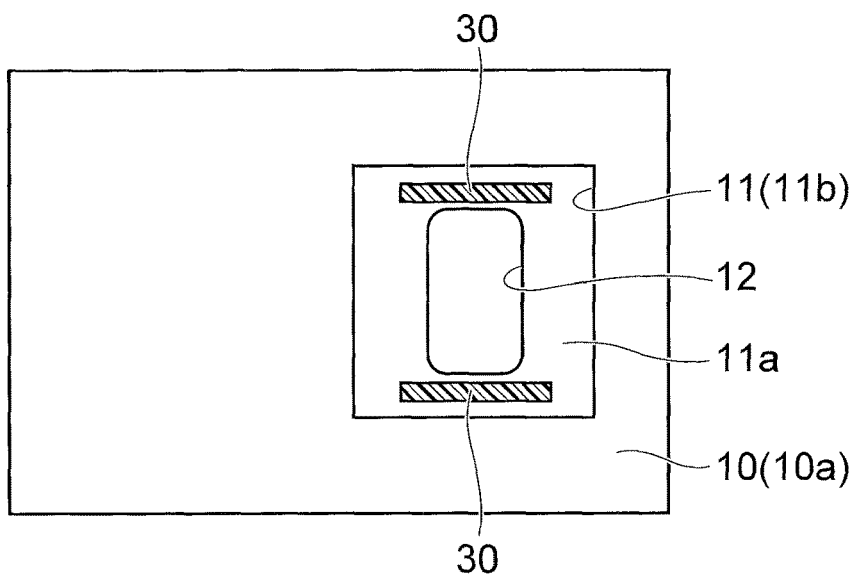
FIG. 7C is a schematic bottom view for illustrating the positional relationship between the first mounting board and the cushion in a modification of the first embodiment.
Figure 8A:
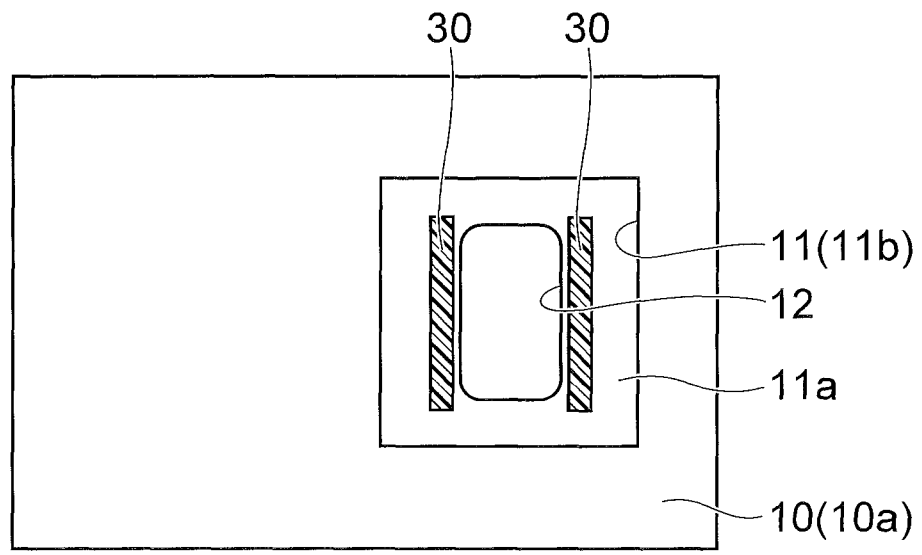
FIG. 8A is a schematic bottom view for illustrating the positional relationship between the first mounting board and the cushion in a modification of the first embodiment.
Figure 8B:
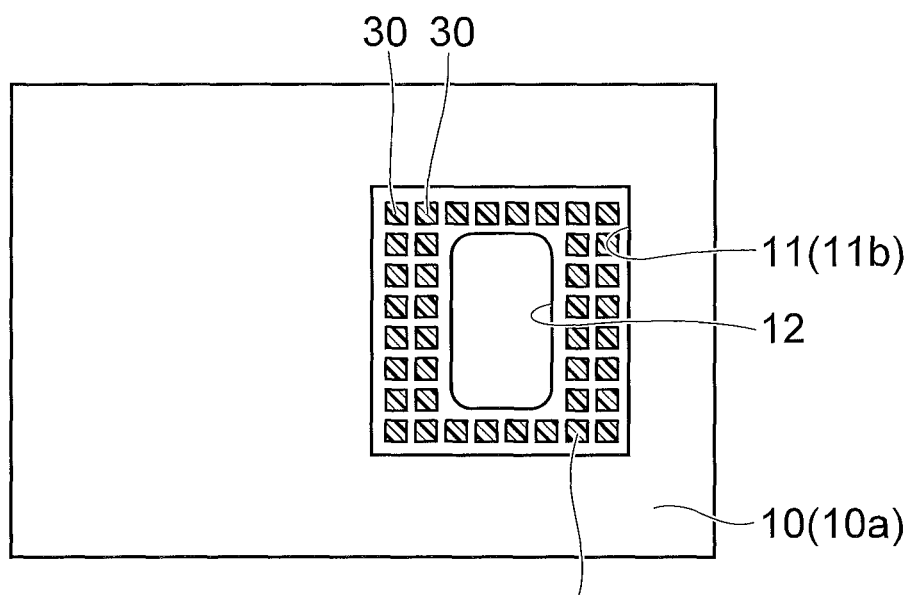
FIG. 8B is a schematic bottom view for illustrating the positional relationship between the first mounting board and the cushion in a modification of the first embodiment.

The cushion 30 may be disposed over only a portion of the bottom surface 11a of the recess 11 of the first mounting board 10. The shape of the cushion 30 in such modifications in a plan view will be described below. For example, the cushion 30 may be formed into a frame surrounding the opening 12 and may be apart from the lateral surface 11b of the recess 11 as shown in FIG. 6B. With this structure, the cushion 30 can be deformed in the horizontal direction when compressed in the thickness direction, and the amount of change in the thickness increases. The cushion 30 may be formed into a frame having breaks 30c as shown in FIG. 6C. With this structure, the cushion 30 can be more easily deformed in the horizontal direction. The cushion 30 may be U-shaped along three sides of the opening 12 as shown in FIG. 7A and FIG. 7B. The cushion 30 may be formed into two strips along two opposite sides of the opening 12 as shown in FIG. 7C and FIG. 8A. The cushion 30 may be formed into dots as shown in FIG. 8B. The shape of the cushion 30 may be a combination of these shapes.

Figure 9A:
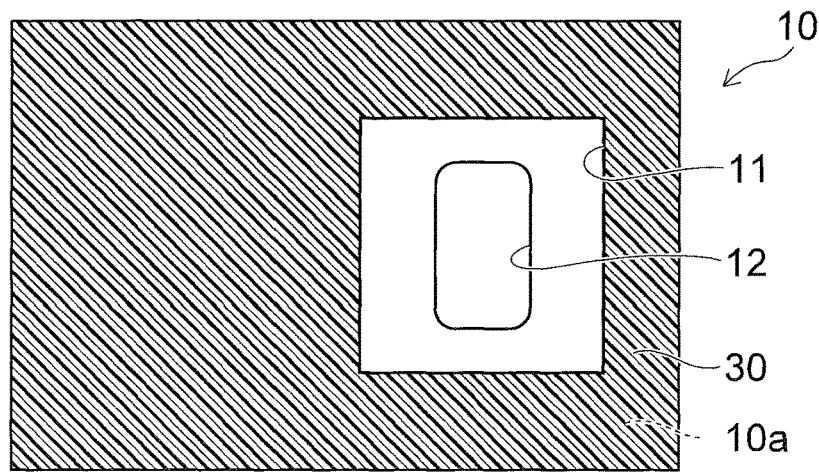
FIG. 9A is a schematic bottom view for illustrating the positional relationship between the first mounting board and the cushion in the second embodiment.
Figure 9B:
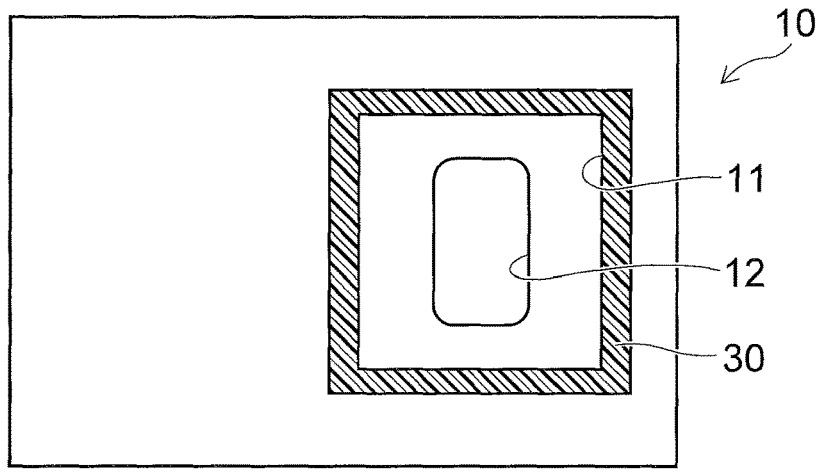
FIG. 9B is a schematic bottom view for illustrating the positional relationship between the first mounting board and the cushion in a modification of the second embodiment.
Figure 9C:
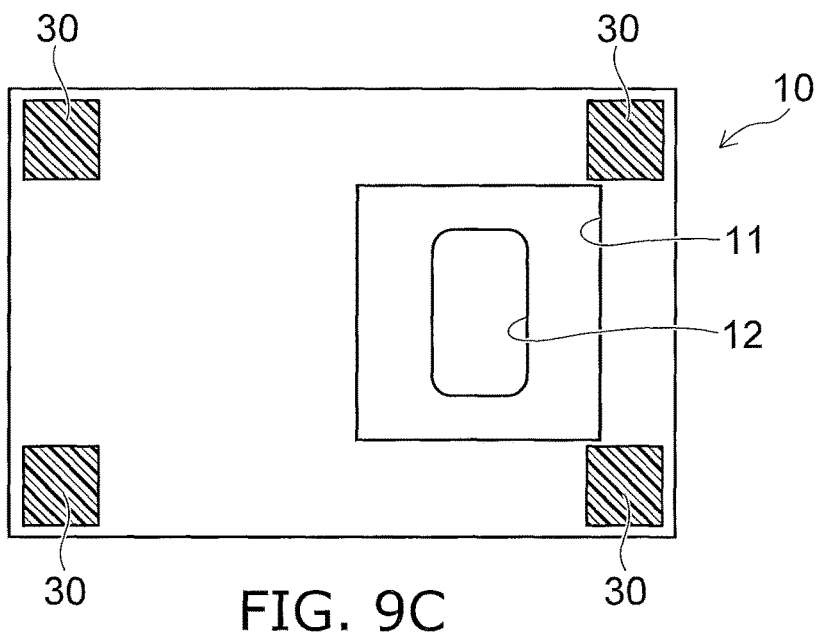
FIG. 9C is a schematic bottom view for illustrating the positional relationship between the first mounting board and the cushion in a modification of the second embodiment.

FIG. 9A to FIG. 9C are schematic bottom views for illustrating the positional relationship between the first mounting board and the cushion in modifications of the second embodiment.

To facilitate understanding of the drawings, the cushion 30 is indicated by hatching, and illustration of the through-holes 16 is omitted also in FIG. 9A to FIG. 9C.

As shown in FIG. 9A, the cushion 30 may be disposed over the entire region of the first surface 10a of the first mounting board 10 except for the recess 11. This structure corresponds to the second embodiment. Actually, in a plan view, a minute gap may be present between the lateral surface 11b of the recess 11 and a lateral surface of the cushion 30, and a minute gap may be present between a lateral surface of the first mounting board 10 and a lateral surface of the cushion 30. The second embodiment includes such a case.

The cushion 30 may be disposed over only a portion of the region of the first surface 10a of the first mounting board 10 except for the recess 11. The shape of the cushion 30 of such modifications in a plan view will be described below. For example, the cushion 30 may be disposed only around the recess 11 and may be apart from the edges of the first mounting board 10 as shown in FIG. 9B. As shown in FIG. 9C, the cushion 30 may be disposed only in four corners of the first surface 10a of the first mounting board 10.

Fourth Embodiment

Next, a fourth embodiment will be described.

Figure 10A:
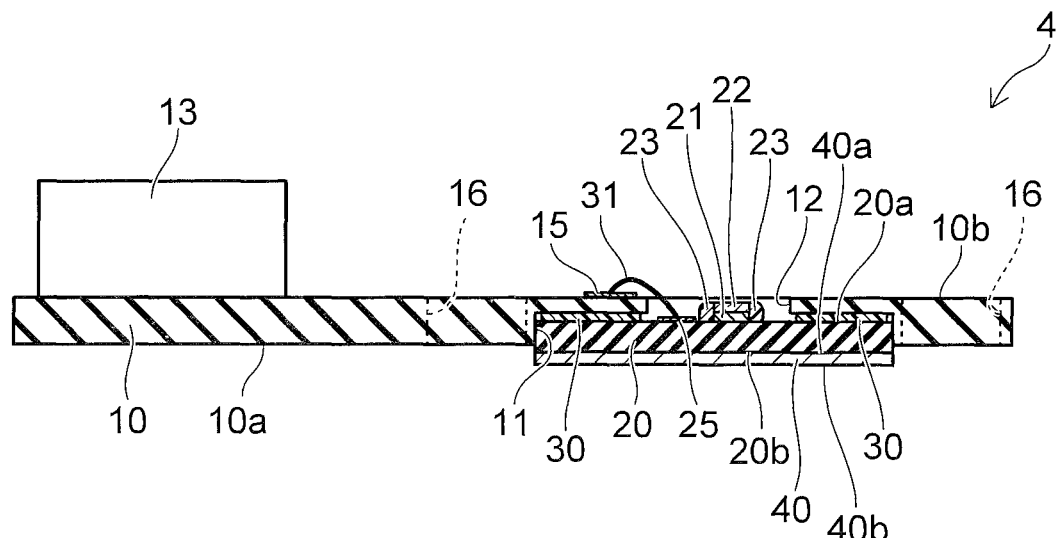
FIG. 10A is a schematic cross-sectional view of a light-emitting module according to a fourth embodiment not fixed to the fixing base.
Figure 10B:
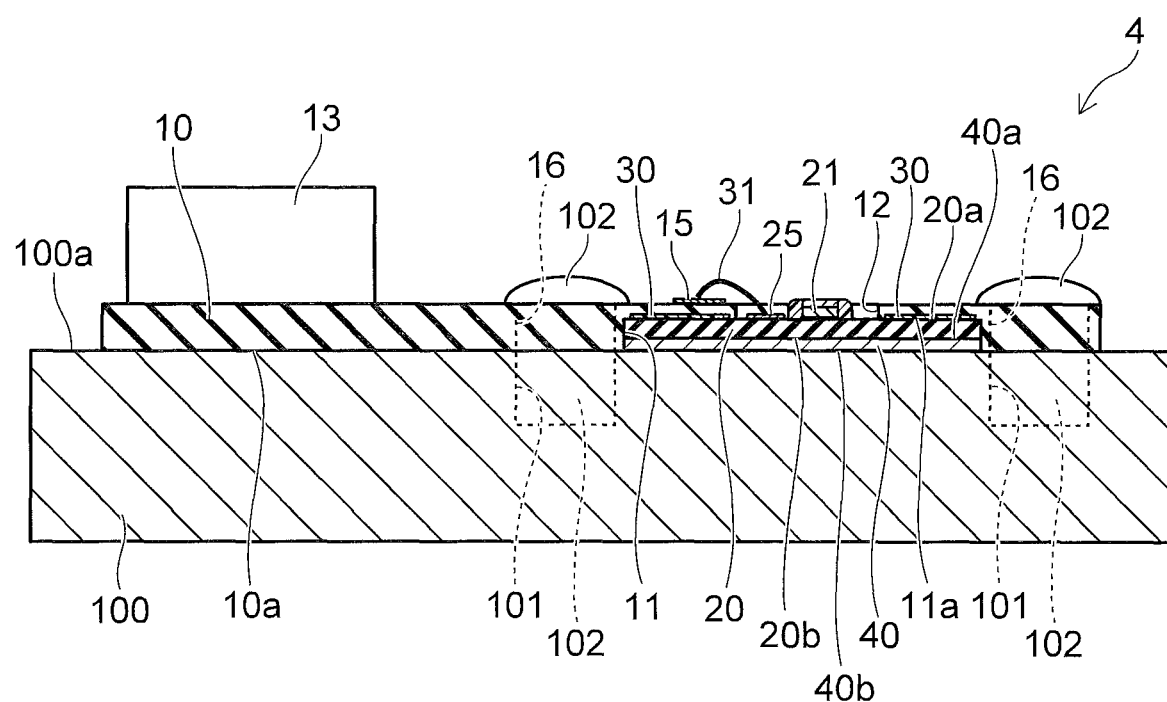
FIG. 10B is a schematic cross-sectional view of the light-emitting module according to the fourth embodiment fixed to the fixing base.

FIG. 10A and FIG. 10B are schematic cross-sectional views of a light-emitting module according to the present embodiment.

FIG. 10A shows the free state, and FIG. 10B shows the fixed state. FIG. 10A and FIG. 10B show the cross-section corresponding to FIG. 1B.

Figure 11:
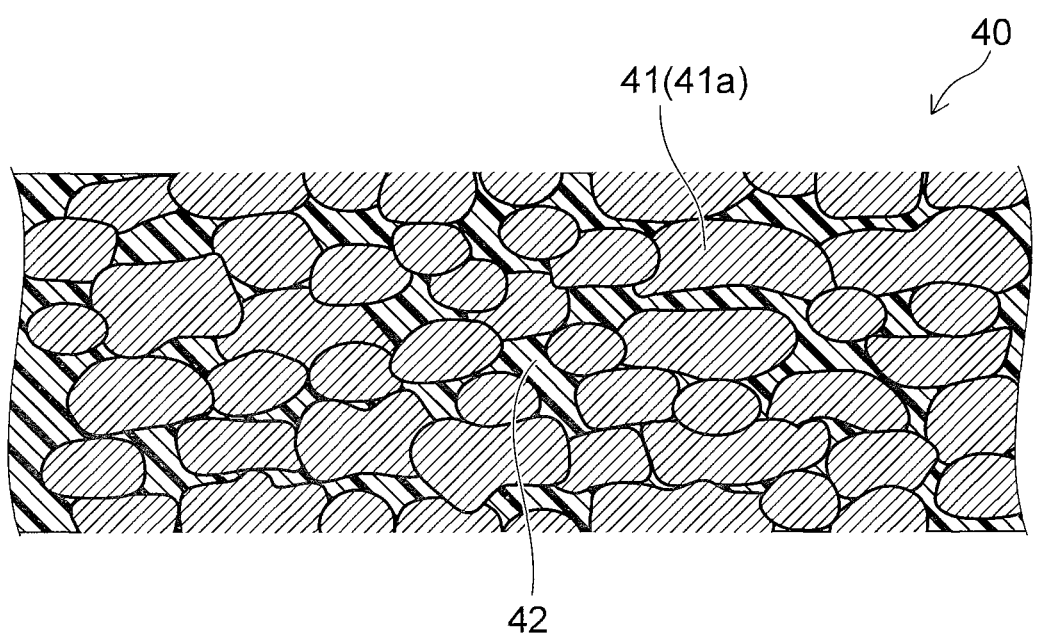
FIG. 11 is a schematic cross-sectional view of a heat-conducting member in the fourth embodiment.

FIG. 11 is a schematic cross-sectional view of a heat-conducting member in the present embodiment.

As shown in FIG. 10A and FIG. 10B, a light-emitting module 4 according to the present embodiment includes a heat-conducting member 40 in addition to the structure of the light-emitting module 1 according to the first embodiment. The heat-conducting member 40 is disposed on the second surface 20b of the second mounting board 20. As described above, the second surface 20b of the second mounting board 20 faces the first surface 20a on which the light-emitting element 21 has been mounted.

The heat-conducting member 40 is, for example, a flat plate lying along the second surface 20b of the second mounting board 20. The thickness of the heat-conducting member 40 is, for example, 10 μm to 500 μm. A first surface 40a of the heat-conducting member 40 is in contact with the second surface 20b of the second mounting board 20.

In the free state, the heat-conducting member 40 partially projects at a second surface 40b from the first surface 10a of the first mounting board 10 as shown in FIG. 10A. The second surface 40b of the heat-conducting member 40 is exposed.

In the fixed state, the cushion 30 is compressed, so that the first surface 10a of the first mounting board 10 and the second surface 40b of the heat-conducting member 40 are brought into contact with the first surface 100a of the fixing base 100 as shown in FIG. 10B. At this time, the second surface 40b of the heat-conducting member 40 is pressed against the first surface 100a of the fixing base 100 by the elastic force of the cushion 30.

The heat-conducting member 40 includes a metal portion 41 and a resin portion 42 as shown in FIG. 11. The metal portion 41 is made of a plurality of metal powder particles 41a connected to each other. The metal portion 41 contains metal. The metal portion 41 is made of, for example, pure metal. The metal portion 41 contains one or more metals selected from the group consisting of, for example, gold (Au), silver (Ag), and copper (Cu). The resin portion 42 contains a resin material. A portion of the resin portion 42 is located between the metal powder particles 41a.

The heat-conducting member 40 does not necessarily contain the resin portion 42. In this case, air gaps may be formed between the metal powder particles 41a.

Next, a method for forming the heat-conducting member 40 will be described.

Figure 12A:
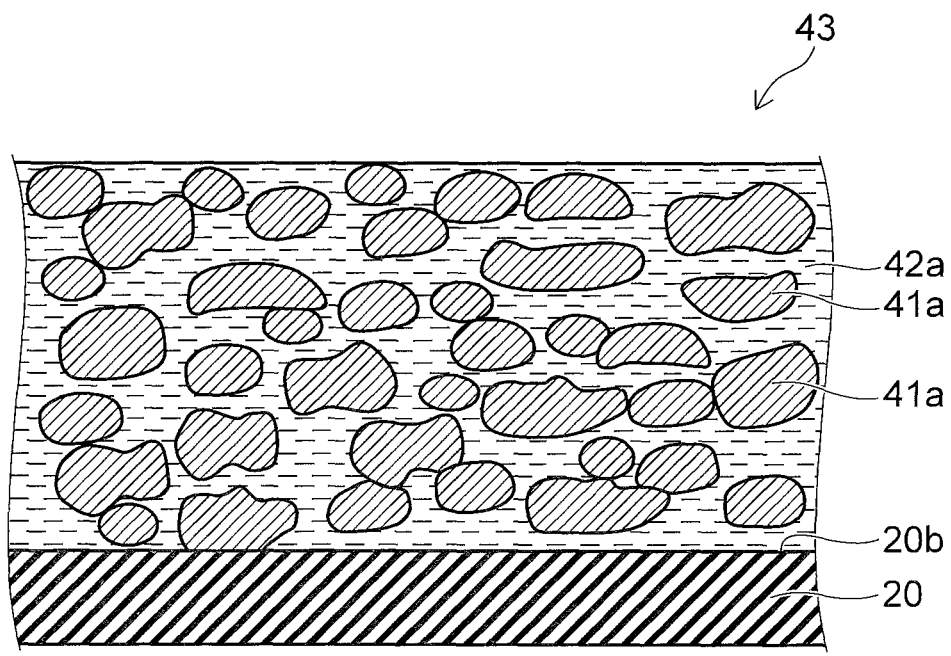
FIG. 12A is a schematic cross-sectional view for illustrating a method for forming the heat-conducting member in the fourth embodiment.

FIG. 12A is a schematic cross-sectional view for illustrating the method for forming the heat-conducting member in the present embodiment.

Figure 12B:
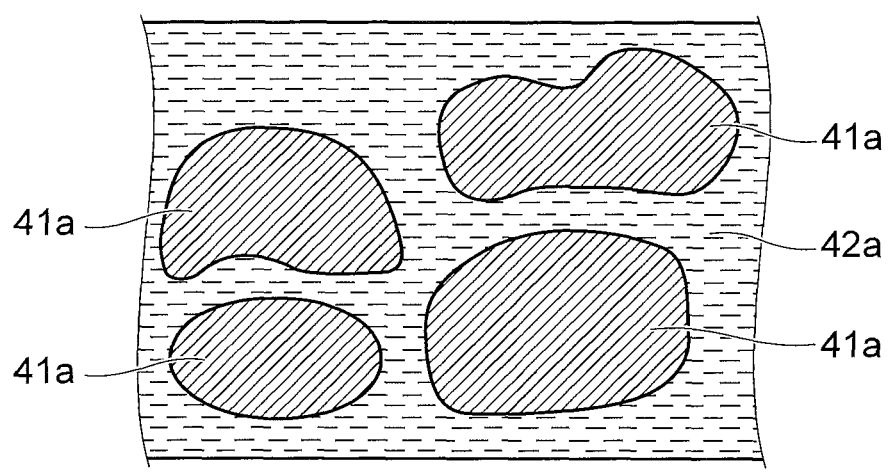
FIG. 12B is a schematic enlarged cross-sectional view of a portion that includes metal powder particles shown in FIG. 12A.

FIG. 12B is a schematic enlarged cross-sectional view of a portion that includes metal powder particles shown in FIG. 12A.

Figure 13A:
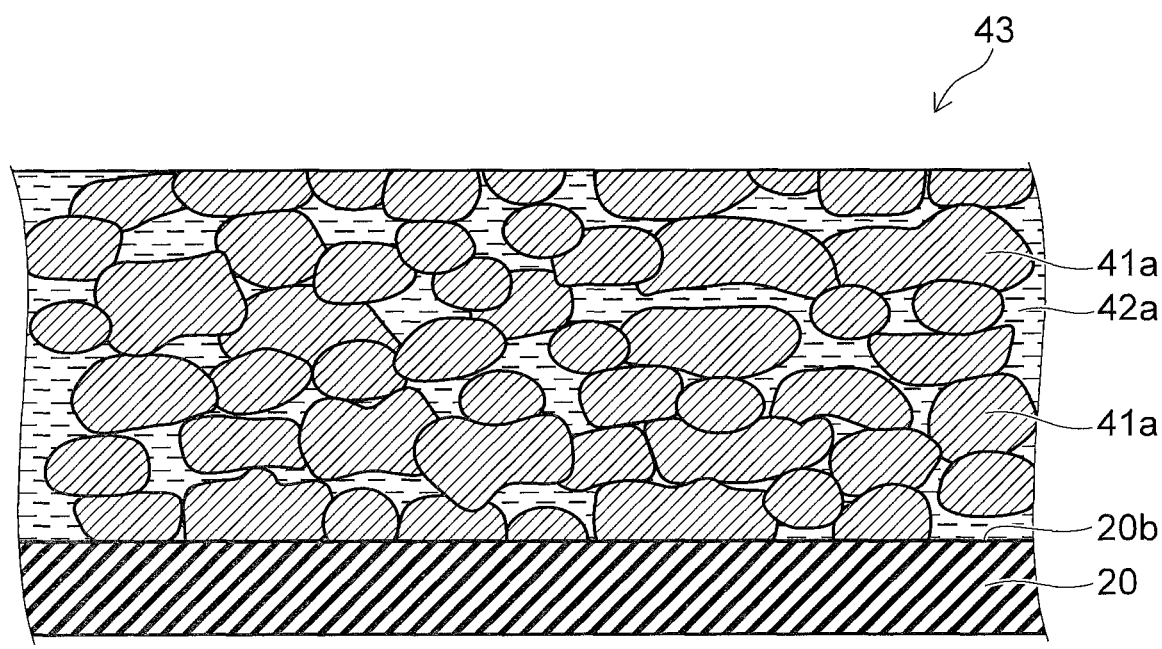
FIG. 13A is a schematic cross-sectional view for illustrating the method for forming the heat-conducting member in the fourth embodiment.

FIG. 13A is a schematic cross-sectional view for illustrating the method for forming the heat-conducting member in the present embodiment.

Figure 13B:
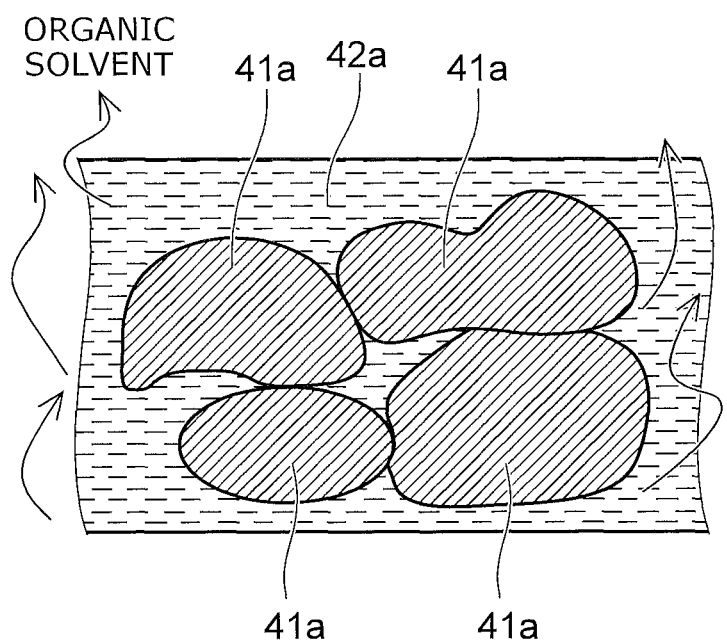
FIG. 13B is a schematic enlarged cross-sectional view of a portion that includes metal powder particles shown in FIG. 13A.

FIG. 13B is a schematic enlarged cross-sectional view of a portion that includes metal powder particles shown in FIG. 13A.

Figure 14A:
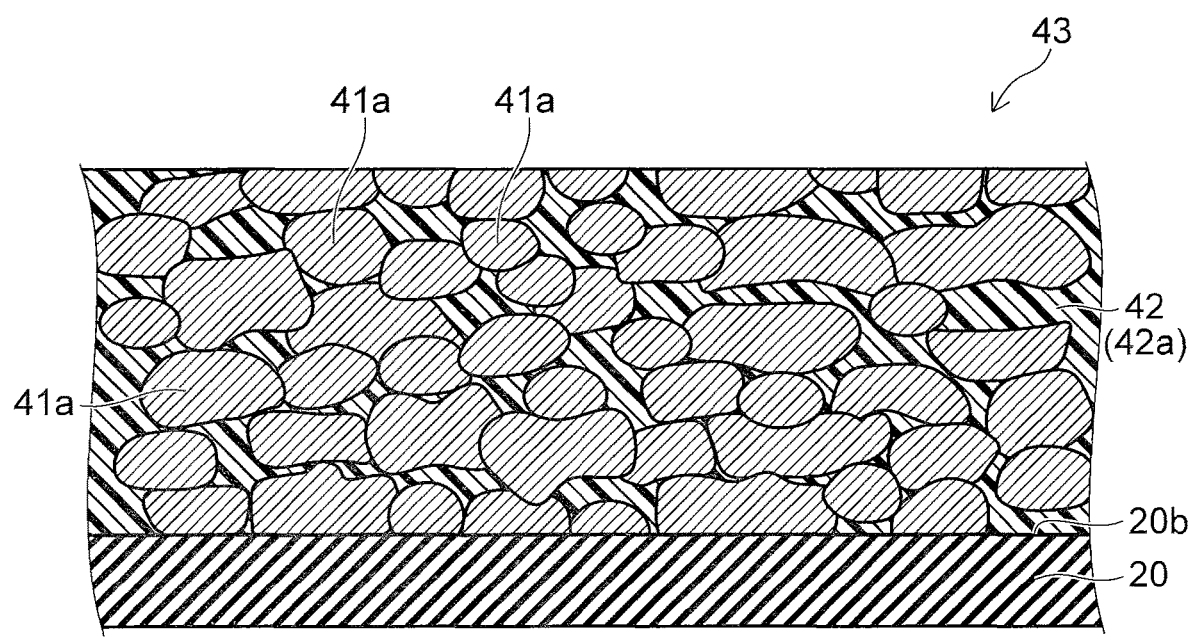
FIG. 14A is a schematic cross-sectional view for illustrating the method for forming the heat-conducting member in the fourth embodiment.

FIG. 14A is a schematic cross-sectional view for illustrating the method for forming the heat-conducting member in the present embodiment.

Figure 14B:
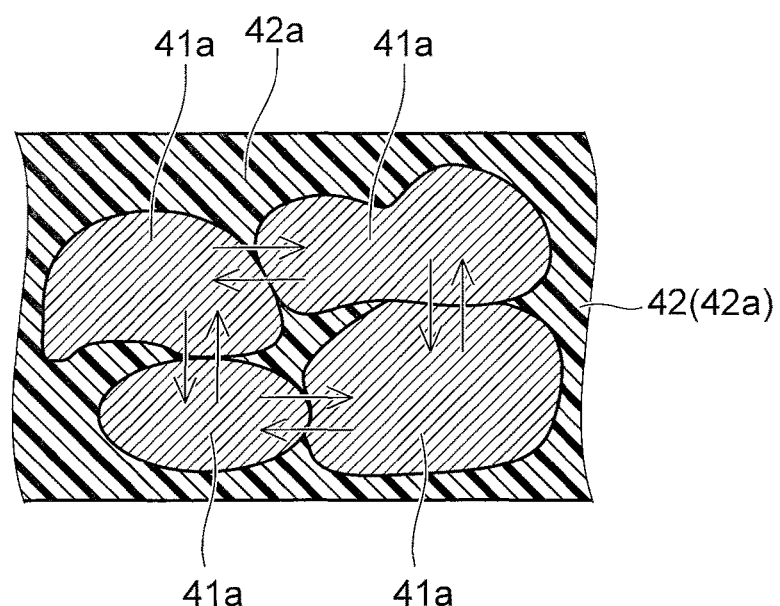
FIG. 14B is a schematic enlarged cross-sectional view of a portion that includes metal powder particles shown in FIG. 14A.

FIG. 14B is a schematic enlarged cross-sectional view of a portion that includes metal powder particles shown in FIG. 14A.

Figure 15A:
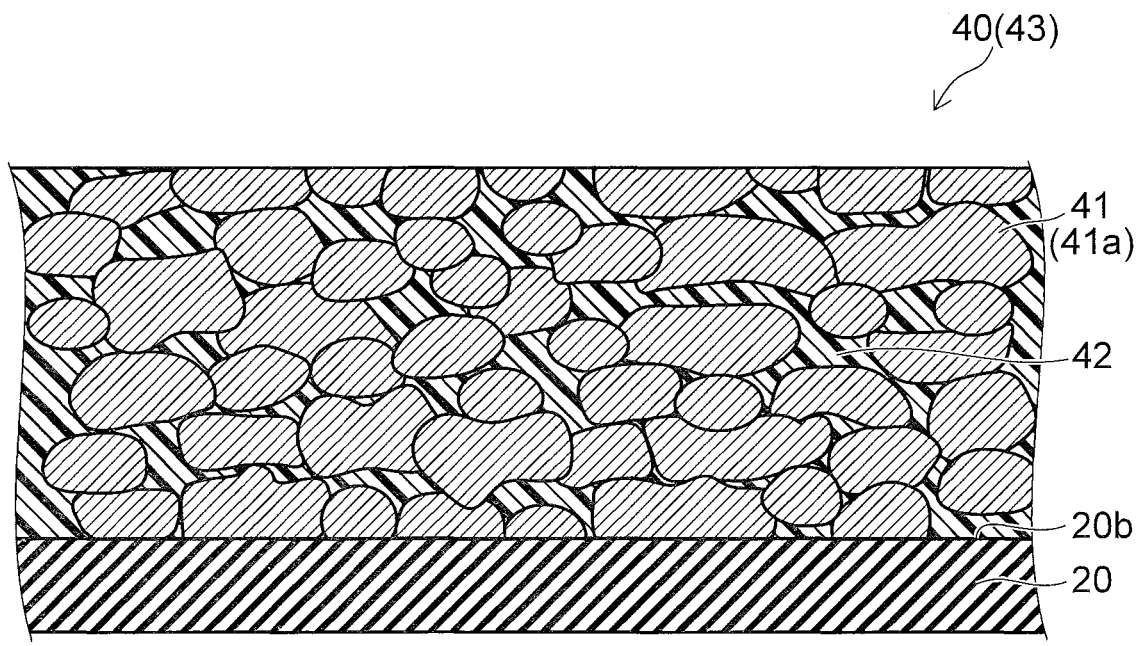
FIG. 15A is a schematic cross-sectional view for illustrating the method for forming the heat-conducting member in the fourth embodiment.

FIG. 15A is a schematic cross-sectional view for illustrating the method for forming the heat-conducting member in the present embodiment.

Figure 15B:
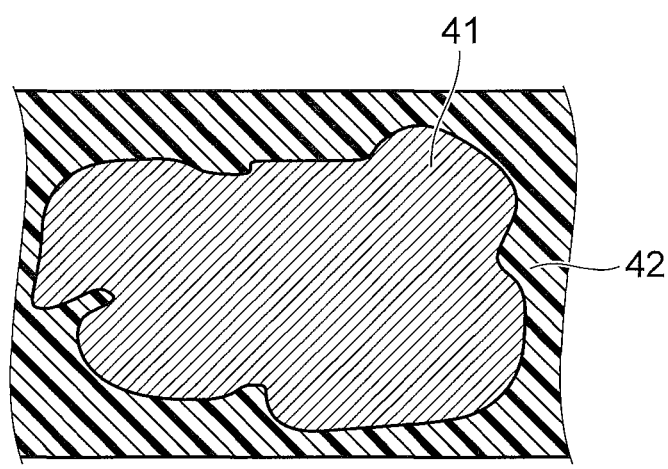
FIG. 15B is a schematic enlarged cross-sectional view of a portion that includes metal powder particles shown in FIG. 15A.

FIG. 15B is a schematic enlarged cross-sectional view of a portion that includes metal powder particles shown in FIG. 15A.

First, a light-emitting module without the heat-conducting member 40 is provided. The structure of the light-emitting module is, for example, the same as the structure of the light-emitting module 1 shown in FIG. 1B. The light-emitting surface of the light-emitting module, that is, the first surface 20a of the second mounting board 20, is caused to face down, and the second surface 20b of the second mounting board 20 is caused to face up.

Next, a paste 43 in which the metal powder particles 41a are dispersed in a resin liquid 42a as shown in FIG. 12A and FIG. 12B is provided. The resin liquid 42a contains a resin material and an organic solvent. The metal powder particles 41a contain metal. The metal powder particles 41a are made of, for example, pure metal. The metal powder particles 41a contain one or more metals selected from the group consisting of, for example, gold, silver, and copper. The particle diameter of the metal powder particles 41a is, for example, 1 μm or less, preferably 500 nm or less, more preferably 100 nm or less. Reducing the particle diameter of the metal powder particles 41a facilitates sintering of the metal powder particles 41a.

Next, the paste 43 is applied over the second surface 20b of the second mounting board 20. In the applied paste 43, the metal powder particles 41a are substantially uniformly dispersed in the resin liquid 42a.

Next, the organic solvent in the paste 43 is volatilized, and the resin material in the paste 43 is cured as shown in FIG. 13A, FIG. 13B, FIG. 14A, and FIG. 14B. For example, the paste 43 is heated to a temperature of 200° C. or lower. Accordingly, the organic solvent is removed from the resin liquid 42a, the metal powder particles 41a are brought into contact with each other, the resin material in the resin liquid 42a is cured to form the solid resin portion 42, and the metal is diffused between the metal powder particles 41a through the contact points between the metal powder particles 41a.

Next, the metal powder particles 41a are sintered as shown in FIG. 15A and FIG. 15B. For example, the paste 43 is heated to a temperature, such as a temperature of 180° C. to 250° C., lower than the melting point of the metal powder particles 41a. The metal powder particles 41a are sintered to form the metal portion 41. At this time, a portion of the resin portion 42 remains between the metal powder particles 41a. The heat-conducting member 40 is thus formed. The light-emitting module 4 shown in FIG. 10A is thus manufactured.

The first mounting board 10 of the light-emitting module 4 is pressed against the fixing base 100 using the screws 102, so that the first mounting board 10 and the heat-conducting member 40 of the light-emitting module 4 are brought into contact with the fixing base 100 as shown in FIG. 10B.

Next, the effects of the present embodiment will be described.

In the present embodiment, the heat-conducting member 40 in which the metal powder particles 41a are sintered is disposed between the second mounting board 20 of the light-emitting module 4 and the fixing base 100, so that the thermal conductivity between the second mounting board 20 and the fixing base 100 can be improved. As the heat-conducting member 40 is formed by solidifying the paste 43, formation of minute gaps between the heat-conducting member 40 and the second surface 20b of the second mounting board 20 can be reduced. High heat dissipation performance can thus be achieved.

The structure and effects in the present embodiment are substantially the same as in the first embodiment except for the above-described points.

Fifth Embodiment

Next, a fifth embodiment will be described.

Figure 16A:
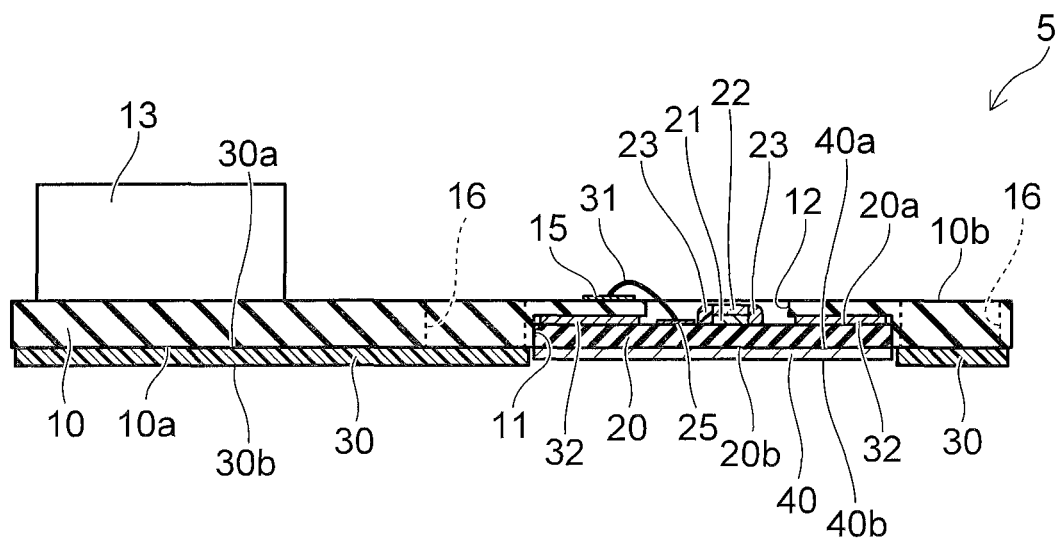
FIG. 16A is a schematic cross-sectional view of a light-emitting module according to a fifth embodiment not fixed to the fixing base.
Figure 16B:
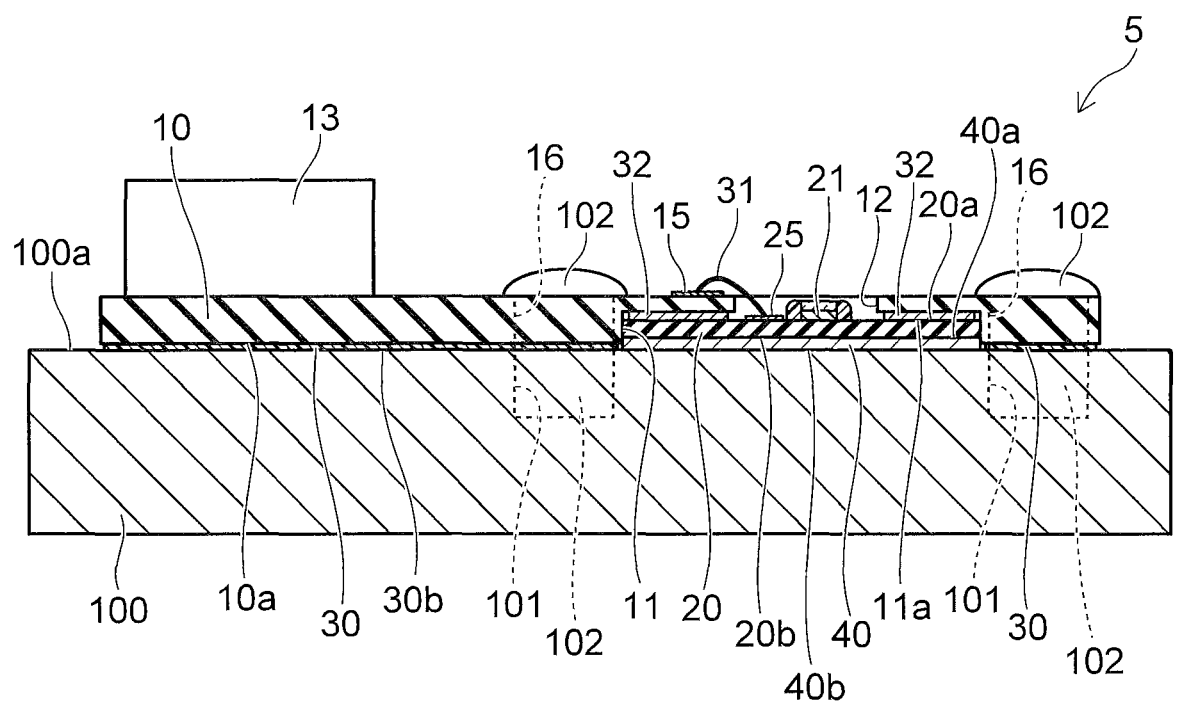
FIG. 16B is a schematic cross-sectional view of the light-emitting module according to the fifth embodiment fixed to the fixing base.

FIG. 16A and FIG. 16B are schematic cross-sectional views of a light-emitting module according to the present embodiment.

FIG. 16A shows the free state, and FIG. 16B shows the fixed state. FIG. 16A and FIG. 16B show the cross-section corresponding to FIG. 3B.

As shown in FIG. 16A and FIG. 16B, a light-emitting module 5 according to the present embodiment includes the heat-conducting member 40 in addition to the structure of the light-emitting module 2 according to the second embodiment. The heat-conducting member 40 is disposed on the second surface 20b of the second mounting board 20. The structure and the forming method of the heat-conducting member 40 are as described in the fourth embodiment.

In the free state, the cushion 30 disposed on the first surface 10a of the first mounting board 10 projects from the heat-conducting member 40 disposed on the second surface 20b of the second mounting board 20 as shown in FIG. 16A.

In the fixed state, the second surface 30b of the cushion 30 and the second surface 40b of the heat-conducting member 40 are brought into contact with the first surface 100a of the fixing base 100 as shown in FIG. 16B. At this time, the cushion 30 and the heat-conducting member 40 are pressed against the fixing base 100.

The heat-conducting member 40 is disposed between the second mounting board 20 and the fixing base 100 also in the present embodiment, so that the thermal conductivity between the second mounting board 20 and the fixing base 100 can be improved.

The structure and effects in the present embodiment are substantially the same as in the second embodiment except for the above-described points.

Sixth Embodiment

Next, a sixth embodiment will be described.

Figure 17:
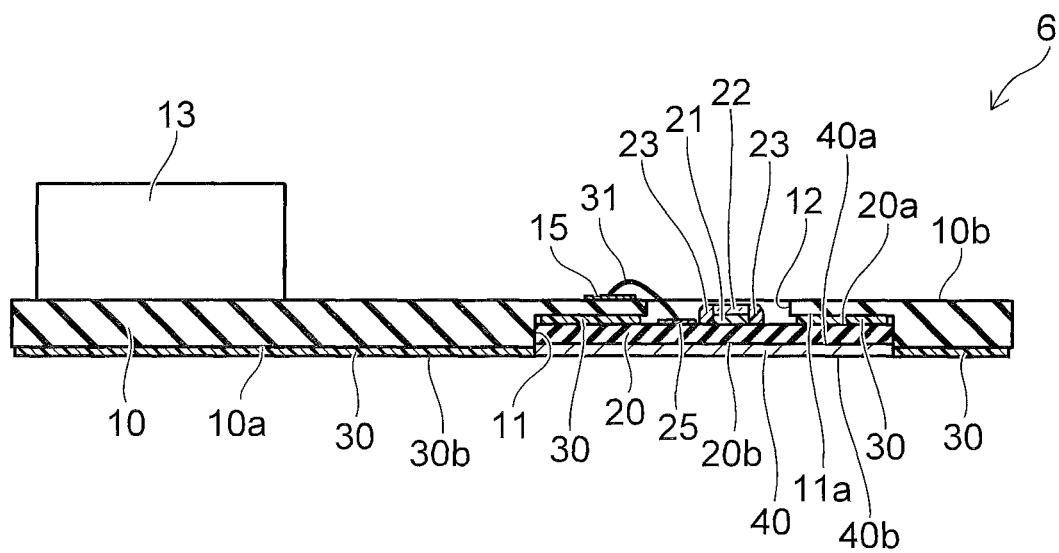
FIG. 17 is a schematic cross-sectional view of a light-emitting module according to a sixth embodiment.

FIG. 17 is a schematic cross-sectional view of a light-emitting module according to the present embodiment.

FIG. 17 shows the cross-section corresponding to FIG. 5.

As shown in FIG. 17, a light-emitting module 6 according to the present embodiment includes the heat-conducting member 40 in addition to the structure of the light-emitting module 3 according to the third embodiment. The heat-conducting member 40 is disposed on the second surface 20b of the second mounting board 20. The structure and the forming method of the heat-conducting member 40 are as described in the fourth embodiment.

The structure and effects in the present embodiment are substantially the same as in the third embodiment except for the above-described points.

Obviously, numerous modifications and variations of the present invention are possible in light of the above teachings. It is therefore to be understood that within the scope of the appended claims, the invention may be practiced otherwise than as specifically described herein.

The invention claimed is:

1. A light-emitting module comprising:
   a first mounting board having a first surface and a second surface opposite to the first surface, the first mounting board having a recess on the first surface, the recess having a bottom surface, the first mounting board having an opening passing through the first mounting board from the bottom surface to the second surface;
   a second mounting board provided in the recess;
   a light-emitting element provided on the second mounting board and configured to emit light through the opening;
   an elastic cushion provided between the first mounting board and the second mounting board; and
   a connector, wherein the connector and the opening sandwich a center of the first mounting board when viewed from a direction from the second surface to the first surface.

2. A light-emitting module comprising:
   a first mounting board having a first surface and a second surface opposite to the first surface, the first mounting board having a recess on the first surface, the recess having a bottom surface, the first mounting board having an opening passing through the first mounting board from the bottom surface to the second surface;
   a second mounting board provided in the recess, the second mounting board having a light-emitting element surface;
   a light-emitting element provided on the light-emitting element surface of the second mounting board and configured to emit light through the opening;
   an elastic cushion provided between the first mounting board and the second mounting board;
   a connector mounted on the second surface of the first mounting board, electrically connected to the light-emitting element, and configured to be electrically connected to an external power supply, wherein the connector and the opening sandwich a center of the first mounting board when viewed from a direction from the second surface to the first surface;
   a first pad disposed on the second surface of the first mounting board, and electrically connected to the connector;
   a second pad disposed on the light-emitting element surface of the second mounting board, and being electrically connected to the light-emitting element; and
   a wire connecting the first pad to the second pad.

\* \* \* \* \*